United States Patent [19]
Lee et al.

[11] Patent Number: 6,147,527
[45] Date of Patent: Nov. 14, 2000

[54] INTERNAL CLOCK GENERATOR

[75] Inventors: Jung-Bae Lee, Gunpo; Sung-Geun Lee, Suwon; Jing-Man Han, Seoul, all of Rep. of Korea

[73] Assignee: Samsung Electronics, Co., Ltd., Suwon, Rep. of Korea

[21] Appl. No.: 09/136,871

[22] Filed: Aug. 19, 1998

[30] Foreign Application Priority Data

Aug. 22, 1997 [KR] Rep. of Korea ............... 97-40275

[51] Int. Cl.[7] ............................................. H03K 5/14
[52] U.S. Cl. ........................................ 327/141; 327/161
[58] Field of Search ..................................... 327/141, 146, 327/147, 149, 150, 153, 156, 158, 159, 161, 291, 293, 294, 299; 331/11

[56] References Cited

U.S. PATENT DOCUMENTS

| | | | |
|---|---|---|---|
| 5,408,200 | 4/1995 | Buhler | 331/1 A |
| 5,708,382 | 1/1998 | Park | 327/277 |
| 5,712,884 | 1/1998 | Jeong | 375/375 |
| 5,901,190 | 5/1999 | Lee | 327/158 |

*Primary Examiner*—Tuan T. Lam
*Attorney, Agent, or Firm*—Marger Johnson & McCollom, P.C.

[57] ABSTRACT

An internal clock generator including a switching controller interposed between a digital delay locked loop and an externally generated clock signal. The switching controller reduces current consumptions starting from a next cycle when an external clock and an internal clock are in phase. Further, when the external clock and the internal clock are in phase, driving of the unnecessary elements is suppressed, thereby reducing the current consumption in the internal clock generator.

25 Claims, 7 Drawing Sheets

INTERNAL CLOCK GENERATOR

BACKGROUND OF THE INVENTION

1. Field of the Invention

The present invention relates to a synchronous DRAM (dynamic random access memory) for synchronizing an internal clock with an externally generated system clock signal, and in particular, to an internal clock signal generator for synchronous DRAM operating with a reduced current consumption.

2. Description of the Related Art

In general, an internal clock signal generator functions as a buffer between a system and a memory chip operating under different voltages. That is, the internal clock generator generates an internal clock signal of a CMOS (Complementary Metal Oxide Semiconductor) level synchronized with an external system clock of a TTL (Transistor Transistor Logic) level generated from the system. It is advantageous to synchronize the internal clock with the system clock in order to define a time point at which the external clocks such as $\overline{RAS0}$, $\overline{CAS0}$ $\underline{RAS}$, $\underline{CAS}$, and $\underline{WE}$($\overline{WE}$ 0received from the exterior of the chip) are applied into the chip, and further to define an output time point.

In operation, a synchronous DRAM generates an internal clock signal in response to the system clock signal, and the internal clock becomes a reference signal in writing and reading data into/from a selected memory element. In order to generate the internal clock signal, the synchronous DRAM generally employs a clock buffer which responds to the externally generated system clock signal. Use of such a clock buffer delays the system clock signal, resulting in a phase difference between the system clock and the internal clock. This delay is undesirable for the proper operation of the memory circuit.

One conventional method for removing the phase difference uses a phase locked loop (PLL) and a delay locked loop (DLL) to minimize the skew between the system clock and the internal clock. This method requires a long time to remove the phase difference which causes an increase of an overall stand-by current even during a stand-by mode at which the device is inactive. Thus, such a conventional method is not suitable for use with a high-speed synchronous DRAM.

Accordingly, an improved method has been developed using a digital delay locked loop having a plurality of unit delay circuits and phase detection circuits as shown in FIG. 1. In this improved method, a clock buffer BDC generates a clock signal PCLK_M delayed for a predetermined time in response to an external clock signal CLK. The clock signal PCLK_M is coupled to a main delay circuit MDC, phase detection circuits PDCi (i=a natural number), and a unit delay circuit BUD1. The main delay circuit MDC has the same time delay value as that of the clock buffer BDC, and generates a clock signal MD with a time delay in response to the clock signal PCLK_M. A plurality of unit delay circuits FUD1–FUDn having the same time delay value are coupled, as a second synchronous delay line, in series to an output terminal of the main delay circuit MDC. The unit delay circuits FUD1–FUDn generate clock signals D1–Dn, respectively. The phase detection circuits PDC1–PDCi (i=n+1, i.e., the number of phase detection circuits is larger by one than that of the unit delay circuits) latch the received clock signals MD and D1–Dn in response to the clock signal PCLK_M. Phase detection circuits PDC1–PDCi then compare outputs of the phase detection circuits of the preceding stages with the latched signals, to generate a signal Fj (representing an unspecified signal). The unspecified signal Fj is activated only when the output of the phase detection circuit and the latched signal are in phase. The phase detection circuits PDC1–PDCi are activated and deactivated according to input signals T1–Ti. That is, the signals T1–Ti disable the phase detection circuits at the following stages of a phase detection circuit which generates the signal Fj which is activated when the external clock CLK and the internal clock PCLK are in phase.

A plurality of the unit delay circuits BUD1–BUDn are coupled in series, as a first synchronous delay line, to an output terminal of the clock buffer BDC and generate clock signals D1'–Dn', respectively. Switches SW1–SWi are respectively coupled between an output terminal of the internal clock signal PCLK and input terminals of the unit delay circuits BUD1–BUDn, whereby a switching operation of the switches SW1–SWi is controlled by the corresponding signals F1–Fi.

FIG. 2 is a diagram for illustrating an output timing of the internal clock generator shown in FIG. 1.

Referring to FIGS. 1 and 2, upon receiving the external system clock signal CLK received via an input terminal of the internal clock generator, the clock buffer BDC generates the clock signal PCLK_M with a predetermined time delay. The main delay circuit MDC having a time delay value corresponding to the time delay value of the clock buffer BDC further delays the clock signal PCLK_M to generate the clock signal MD. Further, the clock signal PCLK_M is applied to the input terminals of a plurality of phase detection circuits PDC1–PDCi (i=n+1, where n represents the number of the unit delay circuits) and an input terminal of a first unit delay circuit BUD1 among the unit delay circuits BUD1–BUDn constituting the first synchronous delay line.

Upon receiving the clock signal MD, the unit delay circuits FUD1–FUDn, coupled in series to an output terminal of the main delay circuit MDC, generate time-delayed clock signals D1–Dn, respectively. Here, the respective unit delay circuits FUD1–FUDn have the same time delay value. Further, the respective unit delay circuits BUD1–BUDn, constituting the first synchronous delay line, have the same time delay value as that of the unit delay circuits FUD1–FUDn.

The clocks signals MD and D1–Dn are applied to input terminals of the corresponding phase detection circuits PDC1–PDCi, and are respectively latched in these circuits under the control of the clock signal PCLK_M. The latched clock signal is compared with a signal output from the phase detection circuit at a preceding stage of a phase detection circuit which performs a comparison operation. If the latched clock signal and the output signal of the phase detection circuit at the preceding stage are in phase, the clock signal Fi is activated. If the clock signal Fi is activated, only the switch SWi associated with the activated clock signal Fi is turned on. The remaining switches maintain a turn-off state. A time-delayed clock signal Dn' generated via the turned-on switch SWi is used for the internal clock signal PCLK where the internal clock signal PCLK is now synchronized with the external clock signal CLK.

As shown in FIG. 2, it takes a total of two complete cycles of the external clock signal CLK for the internal clock signal PCLK to be fully synchronized with the external clock signal CLK. Accordingly, after a lapse of the two cycles of the external clock signal CLK, the internal clock signal PCLK is generated in phase with the external clock signal CLK without the time delay difference. That is, an internal clock generator that uses the technique shown in FIGS. 1 and 2 is an improvement over the conventional phase locked loop or delay locked loop method because the internal clock generator is synchronized with the external clock PCLK much quicker.

Though an improvement in the art, the internal clock generator shown in FIGS. 1 and 2 still has many disadvantages. FIG. 3 shows a detailed circuit diagram of the internal clock generator shown in FIG. 1, connected between the input terminal of the external clock CLK and an output line of the internal clock PCLK, in which the time delay value of the clock buffer BDC is divided. That is, the time delay value of the main delay circuit MDC is identical to the time delay of a clock buffer BDC1 (not shown) plus the time delay of internal delay circuit ID. The clock buffer BDC1 is coupled to an input terminal of the external clock CLK, and the internal delay circuit ID is coupled to the output terminals of the switches SW1–SWi, In one design, the clock buffer BDC can have the same time delay value as that of the main delay circuit MDC without dividing the time delay value thereof. Further, the internal clock generator is connected between the output terminal of the clock buffer BDC1 and the main delay circuit MDC, and includes a logic controller controlled by a switching control signal PSDLE which is activated during read and write operations.

As shown in FIG. 3A, the logic controller includes a NAND gate NG4 which receives the clock signal PCLK_M and the switching control signal PSDLE at two input terminals thereof. The logic controller further includes a NAND gate NG3 which receives an inverse PCLK_M clock signal output of an inverter 123 and the switching control signal PSDLE at two input terminals thereof. An output terminal of the NAND gate NG4 is coupled to input terminals of the phase detection circuits PDC1–PDCi. The output terminal of the NAND gate NG3 is coupled to the first synchronous delay line and an input terminal of the main delay circuit MDC.

Following is a description of the construction and operation of a conventional internal clock generator, with reference to FIGS. 3A/3B. The clock buffer BDC1 which receives the external clock CLK is composed of seres-connected inverters 11–14 (not shown). The main delay circuit MDC is composed of inverters 15–110 connected in series to the output terminal of the clock buffer BDCI for generating the clock signal PCLK_M. Further, in order to have the same time delay value as that of the main delay circuit MDC, the time delay value of the internal delay circuit ID is added to the time delay value of the clock buffer BDC1. Such an internal delay circuit ID is coupled to an output line of the internal clock PCLK, and is composed of series-connected inverters 121 and 122. It is noted that the delay imparted by the clock buffer BDC1 plus the delay imparted by the internal delay circuit ID is equal to the delay imparted by the main delay circuit MDC. Each of the unit delay circuits FUD1–FUDn and BUD1–BUDn are delayed equally by series-connected inverters 111 and 112. Further, the respective phase detection circuits PDC1–PDCi, are composed of transmission gates TG1 and TG2, latch circuits L1 and L2, inverters 116 and 119, and NAND gates NG1 and NG2.

Following is a description of one phase detection circuit PDC1 out of the phase detection circuits PDC1–PDCi, by way of example. The transmission gate TG1, constituting the phase detection circuit PDC1, is composed of a PMOS transistor and an NMOS transistor. A gate of the PMOS transistor is switched in response to the clock signal PCLK_M. A gate of the NMOS transistor is switched in response to the inverse PCLK_M clock signal generated from an inverter NAND gate NG4 connected between the output terminal of the clock buffer BDC1 and the input terminal of the phase detection circuit PDC1.

The phase detection circuits PDC1–PDCi temporarily store the signal output MD or Dn from the second synchronous delay line into a latch L1 by way of the transmission gate TG1, whereby TG1 is switched in response to the high level transition of the clock PCLK_M. The latch circuit L1 is coupled to an output terminal of the transmission gate TG1, and includes two inverters 114 and 115. The inverter 116 for inverting the signal latched at the latch L1 is coupled between the latch L1 and an input terminal of the transmission gate TG2. The transmission gate TG2 performs a switching operation in response to the complementary PCLK_M clock. That is, a gate of the PMOS transistor constituting the transmission gate TG2 is switched in response to the clock PCLK_M. Furthermore, a gate of the NMOS transistor constituting the transmission gate TG2 is switched in response to the inverse clock signal output from the inverter 113.

The latch L2 has an end connected to an output terminal of the transmission gate TG2, and another end connected to a first input terminal of the NAND gate NG1. A second input terminal of the NAND gate NG1 is coupled to an output Ti of the phase detection circuit PDCi of the preceding stage. In the case of the first phase detection circuit PDC1, the signal T1 applied to a second input terminal of the NAND gate NG1 has a voltage of a predetermined high level.

The switch SW1 is driven when the NAND gate NG2 which receives the signal output from the NAND gate NG1 and the signal T1 generates a low level signal output. The NAND gate NG2 is activated when the two input signals are both at the high level. An output terminal of the NAND gate NG1 is coupled to an inverter 119 for generating the signal T2 for activating the phase detection circuit PDC2 of the following stage. An NMOS transistor NT1 coupled to an end of the latch L1 and an NMOS transistor NT2 coupled to an end of the latch L2 are elements for setting an initial level of the phase detection circuit PDC1. A signal VCCHB which is enabled more quickly than power-up of the device is applied to gates of the NMOS transistors NT1 and NT2. The remaining phase detection circuits PDC2–PDCi have the same construction as the above described phase detection circuit PDC1.

Each of the switches SW1–SWi is coupled to an output terminal of the NAND gate NG2 in the corresponding phase detection circuits PDC1–PDCi. The respective switches SW1–SWi include an inverter 120 coupled to the output terminal of the NAND gate NG2, an NMOS transistor that performs a switching operation according to an inverse signal output from the inverter 120, and a PMOS transistor that performs a switching operation according to a signal output from the NAND gate NG2. The PMOS and NMOS transistors of switches SW1–SWi form a transmission gate TG3 which is connected between an input terminal of the respective unit delay circuits BUD1–BUDn and an input terminal of the internal delay circuit ID.

As illustrated in FIG. 2, when the clock signal PCLK_M transits to a high level, the transmission gate TG1 is turned on and the high-level clock signal D11 is applied to the phase detection circuit PDC12. As a result, the input signal T13 (not shown in FIG. 2) of phase detection circuit PDC13 transits from the active high level to the low level, thereby disabling the phase detection circuits PDC13–PDCi of the following stages. That is, the phase detection circuits PDC13–PDCi of the following stages generate the high level via the NAND gate NG2, thereby turning off the switches SW13–SWi. Accordingly, the external clock signal CLK, having passed through the clock buffer BDC1, the unit delay circuits BUD1–BUD11, and the internal delay circuit ID, is used for the internal clock signal PCLK. Such an internal clock signal PCLK is synchronized with the external clock signal CLK without a phase delay difference between them.

The above described internal clock generator must include a great number of the unit delay circuits FUD1–FUDn and BUD1–BUDn, and phase detection circuits PDC1–PDCi. Thus, it can be readily appreciated that the current consumptions of such an internal clock generator is high. Further, in order to secure a low frequency margin, the internal clock generator needs to increase the number of unit delay circuits FUD1–FUDn and BUD1–BUDn, and phase detection circuits PDC1–PDCi, which results in a further increase of the current consumptions.

SUMMARY OF THE INVENTION

It is therefore an object of the present invention to provide an internal clock generator capable of reducing current consumptions starting from a next cycle when an internal clock is synchronized with an external clock.

It is another object of the present invention to provide an internal clock generator capable of reducing current consumptions by disabling unnecessary elements when an internal clock is in phase with an external clock.

To accomplish these objects, a circuit for synchronizing an internal clock signal generator with an externally generated clock signal comprises a digital delay locked loop circuit and switches, coupled to the digital delay locked loop circuit, for selectively transmitting the externally generated signal to the digital delay locked loop circuit responsive to a switching controller. The digital delay locked loop circuit, adapted to receive an externally generated clock signal and output an internal clock signal, includes a plurality of unit delay circuits coupled to an associated plurality of phase detection circuits. A first switch is coupled between the externally generated clock signal and one of the plurality of unit delay circuits. A second switch is coupled between the externally generated clock signal and the plurality of phase detection circuits. A switching controller is coupled to the first and second switches for turning on the first and second switches responsive to a switching control signal, and turning off the first and second switches when the externally generated clock signal and the internal clock signal are in phase. Accordingly, when the internal and external clocks are in phase, the switches are closed thereby preventing current from flowing through the unit delay and phase detection circuits.

More specifically, the switching controller comprises a first transmission gate having a channel coupled between an internal clock signal and a common control terminal of the first and second switches. A first logic gate, adapted to output a first logic output signal, is responsive to the switching control signal and a signal received from the common control terminal. The signal output from the first logic gate controls the first transmission gate. A second logic gate, adapted to output a second logic output signal, is responsive to the switching control signal and a signal received from the common control terminal. The signal output from the second logic gate controls the first and second switches. Turning off the first and second switches acts to disconnect a path for providing a first delayed clock signal from the externally generated clock signal to the unit delay circuits of a second synchronous delay line and the input terminals of the phase detection circuits.

BRIEF DESCRIPTION OF THE DRAWINGS

The above and other objects, features and advantages of the present invention will become more apparent in the light of the following detailed description of an exemplary embodiment thereof taken with the attached drawings in which.

DETAILED DESCRIPTION OF THE PREFERRED EMBODIMENT

Figure 1:
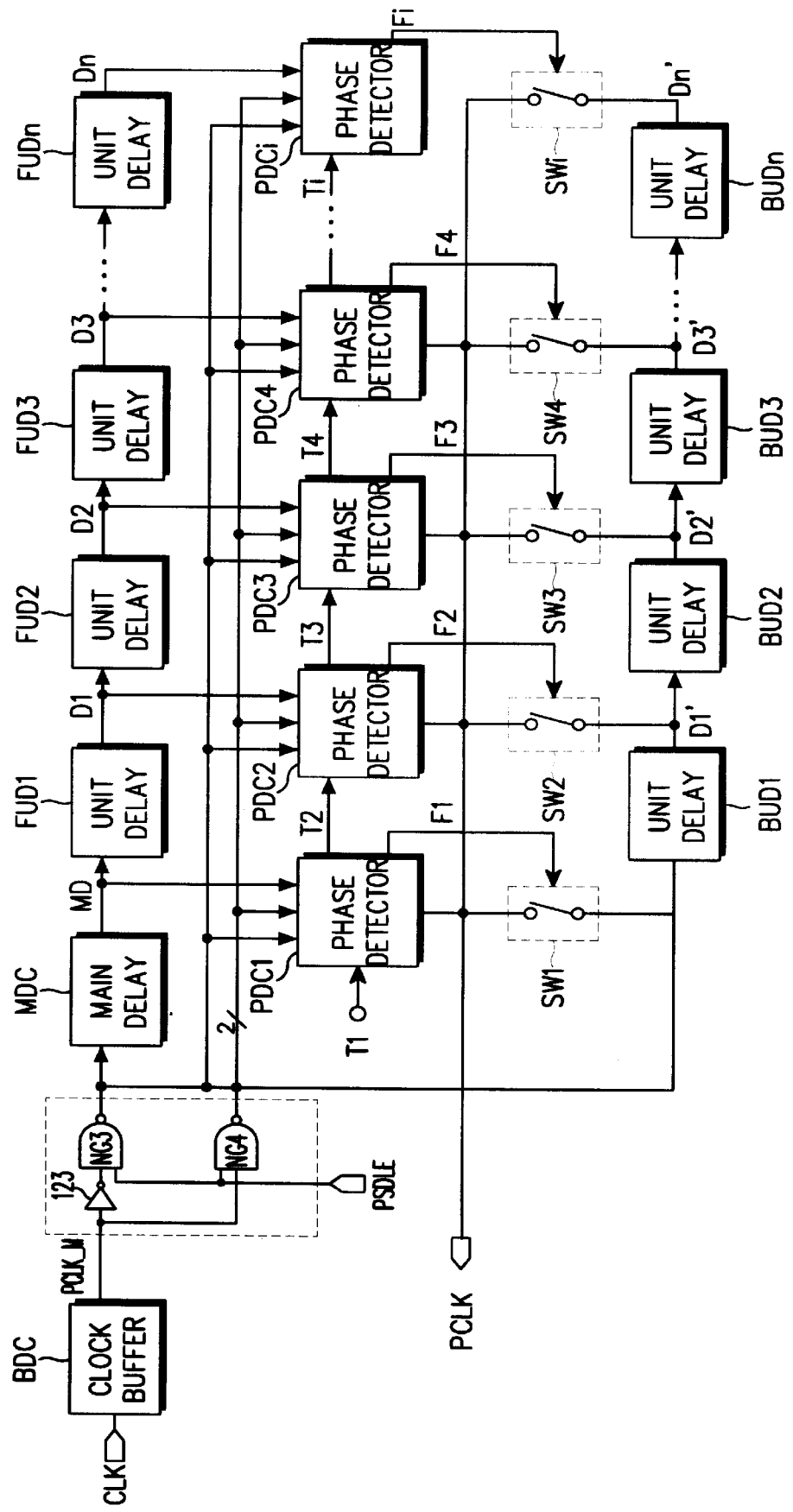
FIG. 1 shows a schematic block diagram of an internal clock generator according to the prior art.
Figure 2:
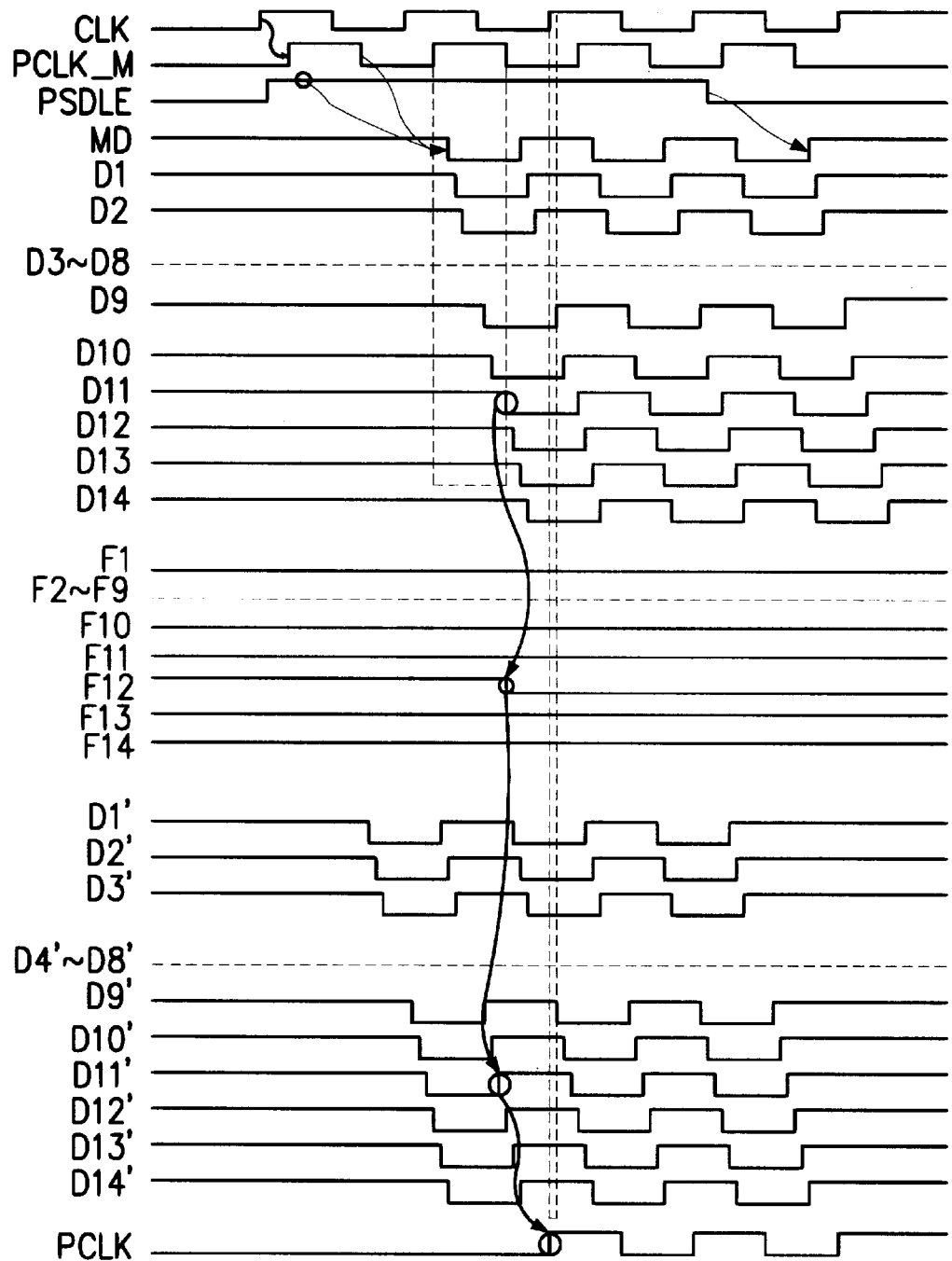
FIG. 2 shows an output timing diagram of the internal clock generator shown in FIG. 1.

A preferred embodiment of the present invention will be described in detail referring to the attached drawings, in which the like reference numerals denote the same elements in the drawings, for understanding. Though the specific embodiment such as the detailed circuit elements will be exemplarily defined and described in detail to clarify the subject matter of the present invention, the present invention may be implemented with the description of the present invention by those skilled in the art even without the details. Consequently, an unnecessary detailed description of the widely known functions and constructions may be avoided here.

Figure 3A:
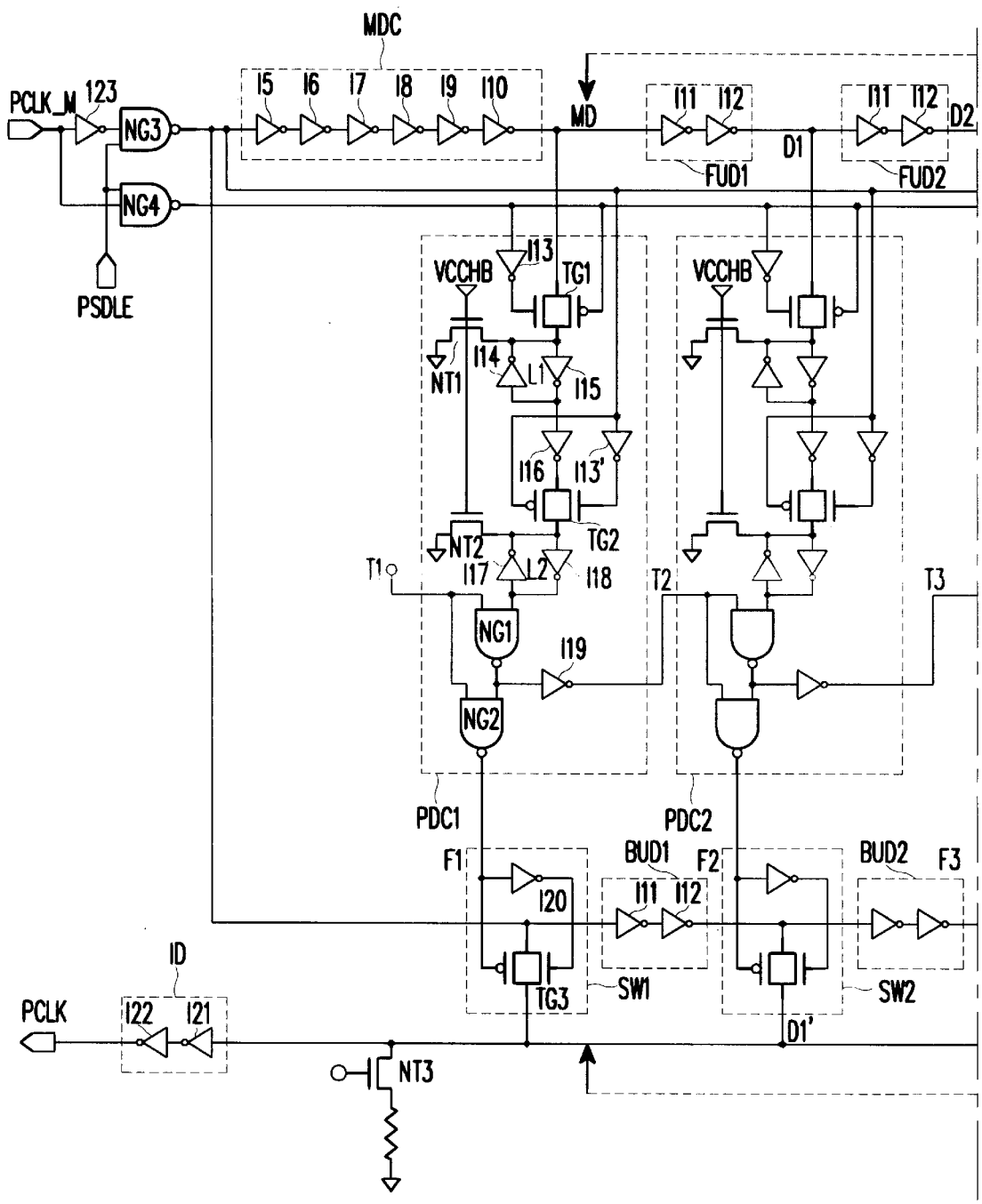
FIGS. 3A/3B show a detailed circuit diagram of the internal clock generator according to the prior art.
Figure 3B:
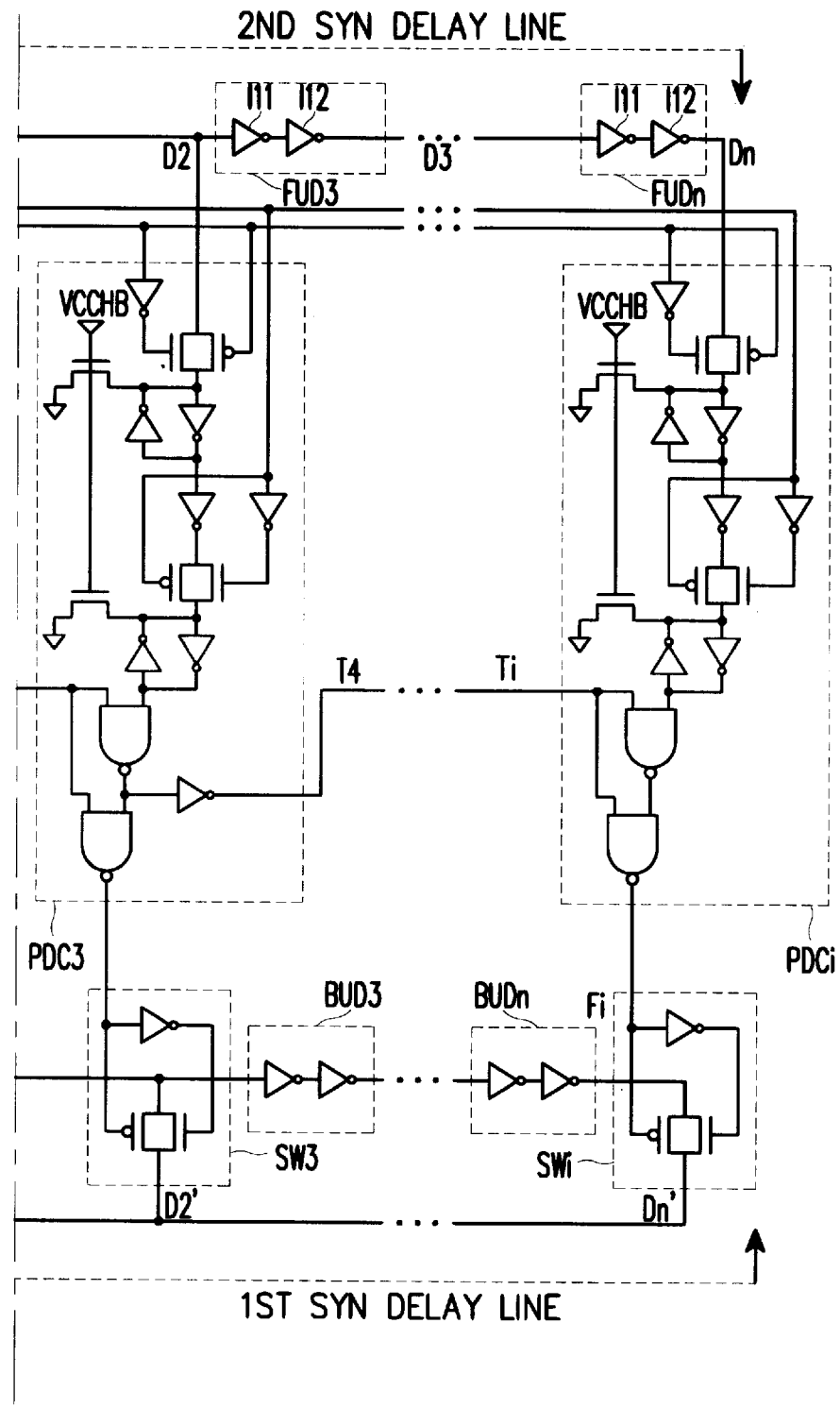
Figure 4A:
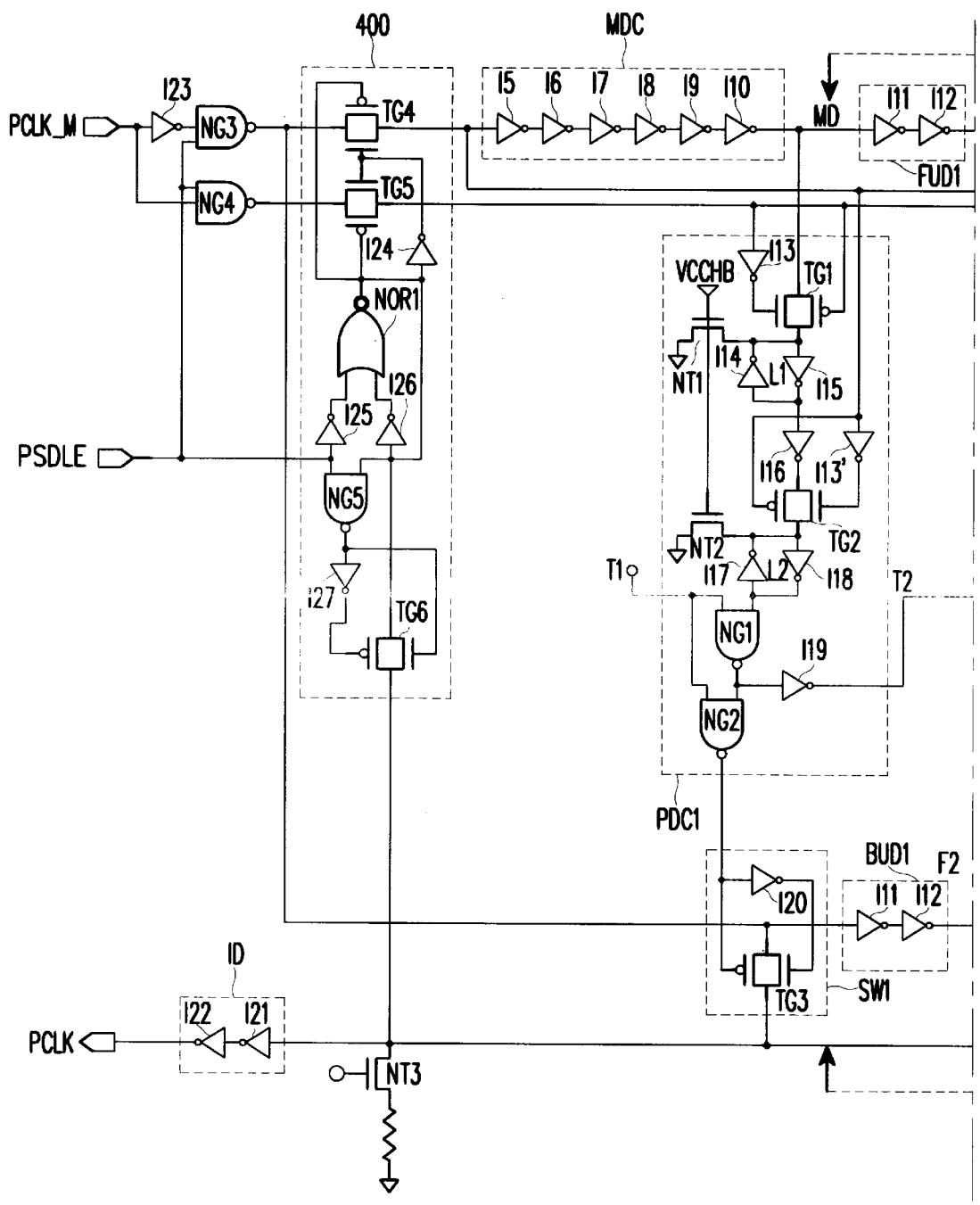
FIGS. 4A/4B show a detailed circuit diagram of an internal clock generator constructed according to a preferred embodiment of the present invention.
Figure 4B:
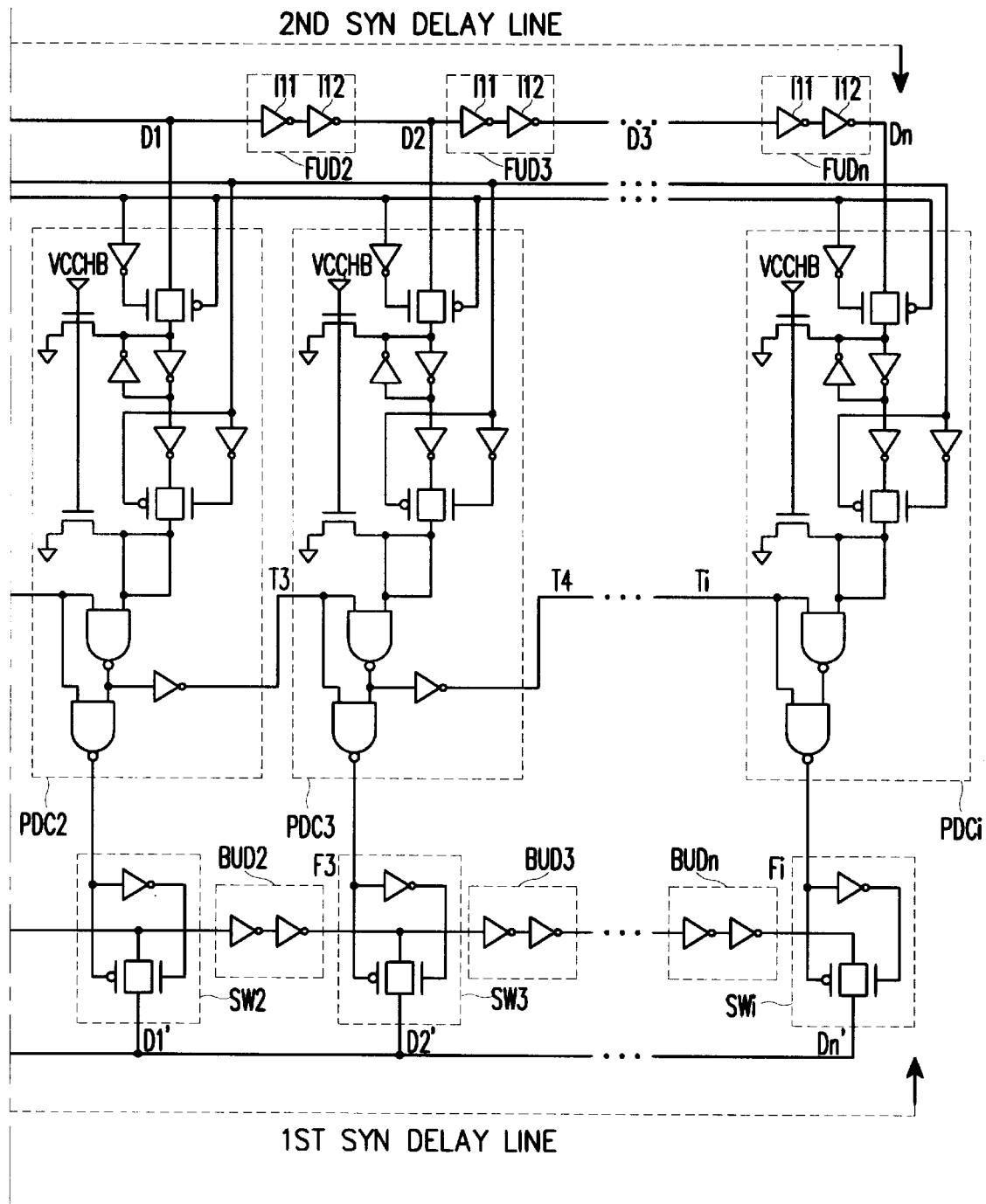
Figure 5:
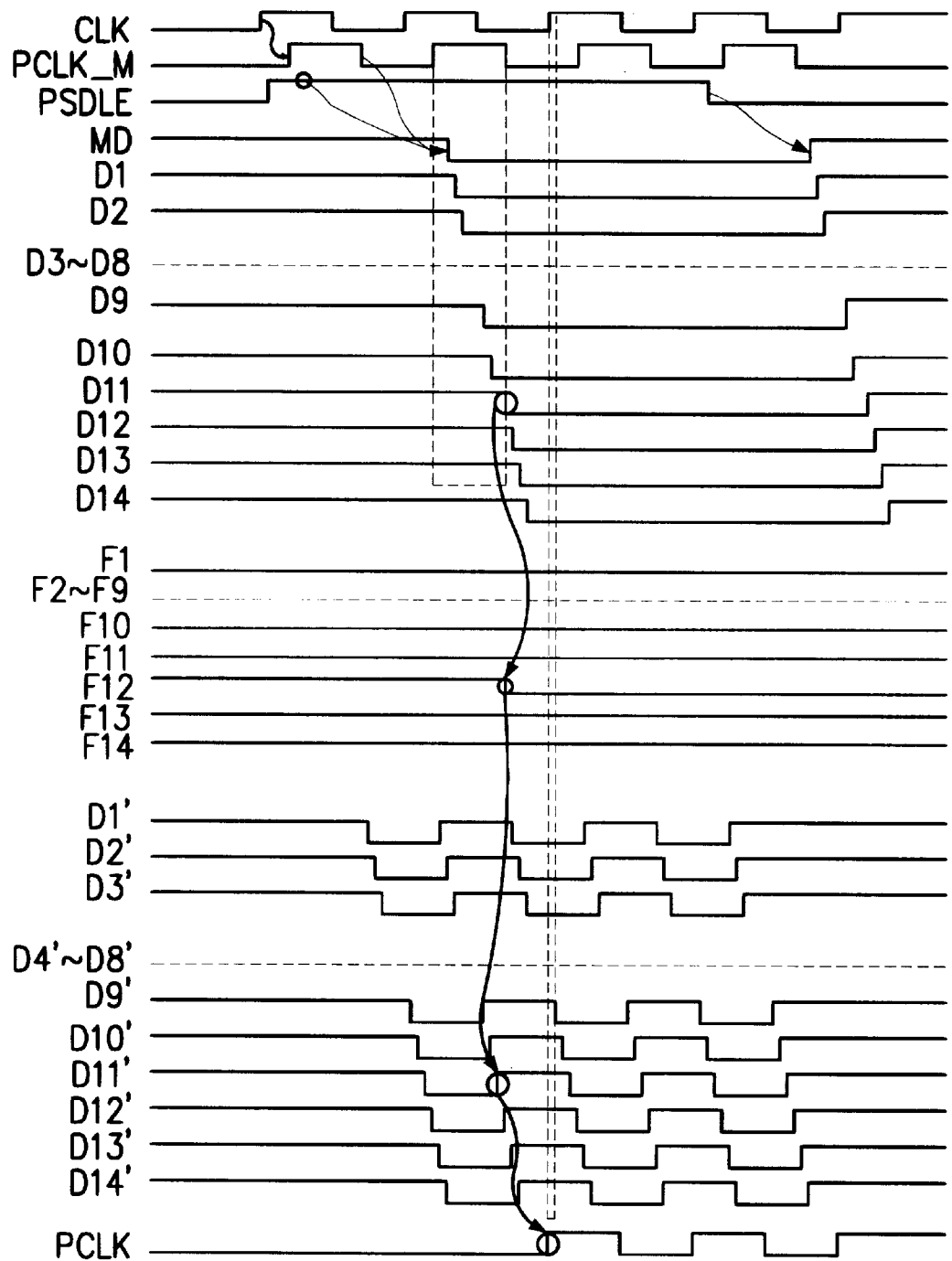
FIG. 5 shows an output timing diagram of the internal clock generator shown in FIG. 4.

Referring to FIGS. 4A/4B, an internal clock generator constructed according to a preferred embodiment of the present invention employs the circuit shown in FIG. 3 and further includes a controller 400 having transmission gates TG4 and TG5 for an additional switching operation, and a switching controller. The controller 400 is coupled to the output terminals of the logic gates NG3 and NG4 to connect and disconnect, through gates TG4 and TG5 respectively, a path for providing the clock signal PCLK_M to the second synchronous delay line and another path for providing the clock signal PCLK_M to the input terminals of the phase detection circuits PDC1–PDCi. That is, the controller 400 disconnects the clock paths passing through the transmission gates TG4 and TG5 when the clock PCLK_M and the internal clock PCLK are in phase, so as to reduce the current consumptions.

The preferred switching controller shown in FIG. 4A further includes a NOR logic gate NOR1 coupled between the switching control signal PSDLE and transmission gates TG4 and TG5. Logic gate NOR1 is adapted to receive at respective input terminals the signal PSDLE and a signal received via the common control terminal of transmission gates TG4 and TG5, each signal being inverted by respective inverters 125 and 126, and generate a signal that activates or deactivates transmission gates TG4 and TG5.

The switching controller further includes a NAND logic gate NG5 coupled between the switching control signal PSDLE and the internal clock signal PCLK. Logic gate NG5 receives inputs from the common control terminal of the transmission gates TG4 and TG5 at one input terminal and the switching control signal PSDLE at the other input terminal. The output of the logic gate NG5 is adapted to control transmission gate TG6 whereby the output is coupled to the gate of the TG6 NMOS transistor while an inverted signal (generated from inverter 127) is coupled to the complementary PMOS transistor. The transmission gate TG6 is coupled between an input terminal of the internal clock signal PCLK and a common control terminal of the transmission gates TG5 and TG5.

Now, referring to FIGS. 4A/4B and 5, if the clock signal PCLK_M and the signal PSDLE are at the low level at an initial state, the transmission gates TG4–TG6 are all turned on to receive the clock signal PCLK_M. The unit delay circuits FUD1–FUDn and BUD1–BUDn, and the phase detection circuits PDC1–PDCi are driven in response to the clock signal PCLK_M received via the transmission gates TG4–TG6 which remain at the turn-on state even though the signal PSDLE transits to the high level. However, if the internal clock signal PCLK is generated by the clock signal Dj (where j represents an unspecified signal) which is synchronized with the external clock signal CLK while passing through the main delay circuit MDC and the unit delay circuits FUD1–FUDn, the transmission gates TG4–TG6 are all turned off by the internal clock PCLK of the high level. Thus, the second synchronous delay line and the phase detection circuits PDC1–PDCi will stop the operation starting from the next cycle. Thereafter, if the signal PSDLE transits to the low level, the transmission gates TG4–TG6 are all turned on to stay in the stand-by state.

The above description is made only on operations related to the controller 400. Now, a brief description will be made on operation of the peripheral elements. As the clock signal PCLK_M, which is delayed for a predetermined time, transits to the high level in response to the external clock CLK, the transmission gate TG1 is turned on. Then, the high-level clock signal D11 is applied to the phase detection circuit PDC12 and the input signal T13 of phase detection circuit PDC13 transits from the active high level to the low level, thereby disabling the phase detection circuits PDC13–PDCi of the following stages. That is, the phase detection circuits PDC13–PDCi of the following stages output a high level signal to respective switches SW13–SWi via the NAND gate NG2. The switches SW13–SWi which receive the high level output of the NAND gate NG2 are consequently turned off. Accordingly, the external clock signal CLK, having passed through the clock buffer BDC1, the unit delay circuits BUD1–BUD11, and the internal delay circuit ID, is synchronized with the internal clock signal PCLK without a phase delay difference between them. Here, it can be appreciated that the transmission gates TG4–TG6 are turned off starting from a time point when the internal clock signal PCLK and the external clock signal CLK are in phase, so that the unit delay circuits FUD1–FUDn and the phase detection circuits PDC1–PDCi are also turned off.

As described above, the internal clock generator according to the present invention can is reduce the current consumptions starting from the next cycle when the external clock and the internal clock are in phase. Further, when the external clock and the internal clock are in phase, driving of the unnecessary elements is suppressed, thereby reducing the current consumptions.

Although a preferred embodiment of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A circuit for synchronizing an internal clock signal with an externally generated clock signal, comprising:
    a digital delay locked loop circuit coupled to receive the externally generated clock signal and output the internal clock signal, said digital delay locked loop circuit having a plurality of unit delay circuits coupled to an associated plurality of phase detection circuits;
    a first switch coupled between the externally generated clock signal and one of the plurality of unit delay circuits;
    a second switch coupled between the externally generated clock signal and the plurality of phase detection circuits; and
    a switching controller coupled to said first and second switches for turning on said first and second switches responsive to a switching control signal, said switching controller is coupled to and receives said internal clock signal for turning off said first and second switches when said externally generated clock signal and said internal clock signal are in phase.

2. The synchronizing circuit of claim 1, wherein the switching controller comprises:
    a first transmission gate having a channel coupled between the internal clock signal and a common control terminal of said first and second switches;
    a first logic gate coupled to output a first logic output signal responsive to the switching control signal and a signal received from the common control terminal, said first logic output signal controlling said first transmission gate; and
    a second logic gate coupled to output a second logic output signal responsive to the switching control signal and a signal received from the common control terminal; said second logic output signal controlling said first and second switches.

3. The synchronizing circuit of claim 2, further including a first inverter interposed between the switching control signal and a first input of the second logic gate and a second inverter interposed between the signal received from the common control terminal and a second input of the second logic gate, wherein said second logic gate is a NOR gate.

4. The synchronizing circuit of claim 2, wherein said first logic gate is a NAND gate.

5. The synchronizing circuit of claim 1, wherein
    said plurality of unit delay circuits of said digital delay locked loop circuit forming:
        a first synchronous delay line having a plurality of unit delay circuits coupled in series; and
        a second synchronous delay line having a plurality of unit delay circuits coupled in series;
    said digital delay locked loop circuit includes:
        comparing means in each of said plurality of phase detection circuits for outputting an activation signal; and
        a plurality of third switches coupled to respective output terminals of said unit delay circuits of said first synchronous delay line for outputting the internal clock signal responsive to the activation signal from a respective phase detection circuit.

6. The synchronizing circuit of claim 2, wherein each of said phase detection circuits includes:
    a first data latch;
    a first transmission gate for transmitting an output signal from a respective unit delay circuit to said first data latch responsive to a first transition of a first clock signal;

a second transmission gate for transmitting an output of said first data latch responsive to a second transition of said first clock signal;

a second data latch for latching an output of said second transmission gate; and a logic circuit for generating an activation signal responsive to an output signal of said second date latch and an input control pulse.

7. The synchronizing circuit of claim 6, wherein said logic circuit includes:

a third logic gate having a first input terminal coupled to an output terminal of said second data latch, and a second input terminal receiving said input control pulse;

a fourth logic gate having a first input terminal receiving said input control pulse, and a second input terminal coupled to an output terminal of said third logic gate; and an inverting circuit for inverting a signal output from said third logic gate to generate an inverse signal output thereof as an output control pulse for a succeeding phase detection circuit.

8. A method for synchronizing an externally generated signal with an internal clock signal in a digital delay locked loop circuit having a plurality of unit delay circuits and a plurality of phase detection circuits, the method comprising the steps of:

interposing a first switch between said externally generated signal and said unit delay circuits, said first switch transmitting said externally generated signal to said unit delay circuits responsive to a switching control signal;

interposing a second switch between said externally generated signal and said phase detection circuits, said second switch transmitting said externally generated signal to said phase detection circuits responsive to said switching control signal;

turning on said first and second switches with said switching control signal when said switching control signal undergoes a first transition; and turning off said first and second switches when said externally generated signal and said internal clock signal are in phase.

9. An internal clock generator for generating an internal clock synchronized with an external clock, comprising:

a clock buffer for delaying said external clock for a predetermined time to generate a first clock;

a main delay circuit having a same time delay value as that of said clock buffer, for generating a second clock being delayed in response to said first clock;

first and second synchronous delay lines each having a plurality of unit delay circuits coupled in series to delay said first and second clocks for a predetermined unit time;

a plurality of phase detection circuits for latching signals generated via said unit delay circuits constituting said second synchronous delay line at an interval when a switching control signal activated during a read or write operation transits from a first level to a second level, to generate an activation signal when the latched signal and said first clock are in phase;

a plurality of first switches coupled to respective output terminals of said unit delay circuits in said first synchronous delay line, for generating output signals of said corresponding unit delay circuits, as said internal clock, in response to the activation signal of said second level;

a logic controller, coupled in between said clock buffer and said main delay circuit, for providing said first clock to said main delay circuit in response to said switching control signal transiting from the first level to the second level;

a second switch coupled between an output terminal of said logic controller and an input terminal of said main delay circuit;

a third switch coupled between an output terminal of said logic controller and input terminals of said phase detection circuits; and a switching controller for turning on said second and third switches as said switching control signal transits from the first level to the second level so as to provide said first clock to said second synchronous delay line and the input terminals of said phase detection circuits, and for turning off said second and third switches by said internal clock when said first clock and said internal clock are in phase so as to disconnect a path for providing said first clock to said second synchronous delay line and the input terminals of said phase detection circuits.

10. An internal clock generator according to claim 9, wherein each of said phase detection circuits comprises:

a first data latch;

a first transmission gate for latching output signals of said unit delay circuits in said second synchronous delay line into said first data latch in response to said first clock transiting to the first level;

a second transmission gate for transmitting an output of said first data latch for an interval when said first clock transits to the second level;

a second data latch for latching an output transmitted from said second transmission gate; and a logic circuit for generating the activation signal of the first level and a control pulse for controlling the phase detection circuit of a following stage of said phase detection circuits, in response to an output signal of said second data latch and said control pulse generated from the phase detection circuit of a preceding stage of said phase detection circuits.

11. An internal clock generator according to claim 10, wherein said logic circuit comprises:

a first logic gate having first input terminal coupled to an output terminal of said second data latch, and a second input terminal receiving said control pulse;

a second logic gate having a first input terminal receiving said control pulse, and a second input terminal coupled to an output terminal of said first logic gate; and an inverting circuit for inverting a signal output from said first logic gate to generate an inverse signal output thereof as said control pulse for the following stage of said phase detection circuits.

12. An internal clock generator according to claim 11, wherein said first logic gate is a NAND gate.

13. An internal clock generator according to claim 11, wherein said second logic gate is a NAND gate.

14. An internal clock generator according to claim 10, wherein said first data latch comprises a data latch, and an inverter coupled to an output terminal of said data latch.

15. An internal clock generator according to claim 10, wherein the phase detection circuits of the following stages are disabled in response to said control pulse of the first level.

16. An internal clock generator according to claim 15, wherein said first level is a low level while said second level is a high level.

17. An internal clock generator according to claim 11, wherein said control pulse received via first input terminals of said first and second logic gates of a first phase detection circuit out of said phase detection circuits is preset to the second level.

18. An internal clock generator according to claim 17, wherein said second level is a high level.

19. An internal clock generator according to claim 11, wherein said inverting circuit comprises an inverter.

20. An internal clock generator according to claim 9, wherein each of said second and third switches is a transmission gate.

21. An internal clock generator according to claim 9, wherein said logic controller comprises a third logic gate receiving said first clock and said switching control signal at two input terminals thereof, and a fourth logic gate receiving the inverted first clock and said switching control signal at two input terminals thereof.

22. An internal clock generator according to claim 21, wherein each of said third and fourth logic gates is a NAND gate.

23. An internal clock generator according to claim 9, wherein said switching controller comprises:

a first transmission gate having a channel coupled between an input terminal of said internal clock and a common control terminal of said second and third switches;

a fifth logic gate receiving a signal received via the common control terminal of said second and third switches and said switching control signal at two input terminals thereof, to control said first transmission gate; and a sixth logic gate receiving said switching control signal and an invented signal received via the common control terminal of said second and third switches at two output terminals thereof, to control said second and third switches.

24. An internal clock generator according to claim 23, wherein said fifth logic gate is a NAND gate.

25. An internal clock generator according to claim 24, wherein said sixth logic gate is a NOR gate.

* * * * *

UNITED STATES PATENT AND TRADEMARK OFFICE
CERTIFICATE OF CORRECTION

PATENT NO.    : 6,147,527
DATED         : November 14, 2000
INVENTOR(S)   : Lee et al.

It is certified that error appears in the above-identified patent and that said Letters Patent is hereby corrected as shown below:

Column 3,
Line 31, "inverter 123" should read -- inverter I23 --.
Line 42, "inverters 11-14" should read -- inverters I1-I4 --.
Line 43, "inverters 15-110" should read -- inverters I5-I10 --.
Line 44, "buffer BDCI" should read -- buffer BDC1 --.
Line 52, "inverters 121 and 122" should read -- inverters I21 and I22 --.
Line 57, "111 and 112" should read -- I11 and I12 --.
Line 60, "116 and 119" should read -- I16 and I19 --.

Column 4,
Lines 12-13, "inverters 114 and 115. The inverter 116" should read -- inverters I14 and I15. The inverter I16 --.
Line 22, "inverter 113" should read -- inverter I13' --.
Line 36, "inverter 119" should read -- inverter I19 --.
Lines 51 and 54, "inverter 120" should read -- inverter I20 --.

Column 5,
Line 67, "extemally" should read -- externally --.

Column 6,
Line 62, "inverters 125 and 126" should read -- inverters I25 and I26 --.

Column 7,
Line 6, "inverter 127" should read -- inverter I27 --.

Signed and Sealed this

Twenty-sixth Day of November, 2002

*Attest:*

*Attesting Officer*

JAMES E. ROGAN
*Director of the United States Patent and Trademark Office*